(12) United States Patent
Choi et al.

(10) Patent No.: US 11,391,798 B2
(45) Date of Patent: Jul. 19, 2022

(54) CONTINUOUS SCANNING METHOD USING SIGNAL SHIELDING AND APPARATUS FOR THE SAME

(71) Applicant: ELECTRONICS AND TELECOMMUNICATIONS RESEARCH INSTITUTE, Daejeon (KR)

(72) Inventors: Seung-Min Choi, Daejeon (KR); Jae-Chan Jeong, Daejeon (KR); Hyo-Bong Hong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 287 days.

(21) Appl. No.: 16/734,217

(22) Filed: Jan. 3, 2020

(65) Prior Publication Data

US 2020/0217910 A1 Jul. 9, 2020

(30) Foreign Application Priority Data

Jan. 3, 2019 (KR) .................. 10-2019-0000872
Dec. 11, 2019 (KR) .................. 10-2019-0164476

(51) Int. Cl.
*G01R 33/12* (2006.01)
*G01R 33/34* (2006.01)
*G01R 33/00* (2006.01)

(52) U.S. Cl.
CPC ... *G01R 33/34053* (2013.01); *G01R 33/0023* (2013.01); *G01R 33/12* (2013.01)

(58) Field of Classification Search
CPC .......... G01R 33/34053; G01R 33/0023; G01R 33/12; G01R 33/00; G01R 33/0035;
(Continued)

(56) References Cited

U.S. PATENT DOCUMENTS

| 10,267,867 B2 | 4/2019 | Choi et al. |
| 2009/0153275 A1* | 6/2009 | Lee .......................... H03J 3/20 334/45 |

(Continued)

FOREIGN PATENT DOCUMENTS

| JP | 2812703 B2 | 10/1998 |
| KR | 20180040306 A | 4/2018 |

OTHER PUBLICATIONS

Knopp et al., "Magnetic Particle Imaging, Chapter 2.4. How Magnetic Particle Imaging Works," Springer-Verlag Berlin Heidelberg, 2012,DOI10.1007/978-3-642-04199-0 2.

(Continued)

*Primary Examiner* — Jermele M Hollington
*Assistant Examiner* — Taqi R Nasir

(57) ABSTRACT

Disclosed herein are a continuous scanning method using signal shielding and an apparatus for the continuous scanning method. The continuous scanning method includes producing a magnetic field on consecutively input samples by applying a signal to an excitation solenoid coil, blocking signal detection in a partial region so that only one harmonic peak is detected by a detection solenoid coil, which is a differential coil, using a magnetic field produced by at least one magnet, and sequentially detecting one harmonic peak in the samples based on the detection solenoid coil, and performing scanning of nanomagnetic particles on respective samples based on a signal for the detected harmonic peak.

14 Claims, 6 Drawing Sheets

(58) Field of Classification Search
CPC ............ G01R 33/0017; G01R 31/3191; G01B 7/004; G01C 17/38; G06F 3/017; G06F 3/0346; G06F 3/012
See application file for complete search history.

(56) References Cited

U.S. PATENT DOCUMENTS

2018/0052123 A1\* 2/2018 Jerschow ........... G01R 33/5608
2018/0100901 A1\* 4/2018 Choi .................. G01R 33/0023

OTHER PUBLICATIONS

Krause et al., "Magnetic particle detection by frequency mixing for immunoassay applications," Journal of Magnetism and Magnetic Materials, 2007, vol. 311 pp. 436-444.
A product "MagRay 1000" description of Mac Solution Corporation, Nov. 26, 2018, pp. 1-2.

\* cited by examiner

CONTINUOUS SCANNING METHOD USING SIGNAL SHIELDING AND APPARATUS FOR THE SAME

CROSS REFERENCE TO RELATED APPLICATIONS

This application claims the benefit of Korean Patent Application Nos. 10-2019-0000872, filed Jan. 3, 2019 and 10-2019-0164476, filed Dec. 11, 2019, which are hereby incorporated by reference in their entireties into this application.

BACKGROUND OF THE INVENTION

1. Technical Field

The present invention relates generally to technology for performing continuous scanning using signal shielding, and more particularly, to technology that is capable of performing scanning on consecutively input samples by blocking signal detection in some regions so that a single harmonic peak signal is detected by a differential coil using a magnet.

2. Description of the Related Art

Nanomagnetic particles (NMP) have the property of being nonlinearly magnetized during magnetization. In detail, it is known that, when a ferromagnetic substance exists as a substance of small units 100 nm in size or less, it has a super-paramagnetic property. A lot of research into technology for measuring the amount of nanomagnetic particles using such a property has been conducted, and there are cases where related products are developed.

Meanwhile, in order to detect a very small amount of nanomagnetic particles, a differential coil is chiefly used in a detection solenoid coil 120, as illustrated in FIG. 1. In such a differential coil, harmonic peaks may occur at two points corresponding to intermediate locations between the center point and the two ends of the differential coil in which the direction of current changes. For this reason, the detection solenoid coil 120 which uses the differential coil has a limitation in that the detection solenoid coil 120 is used only for the purpose of a spectrometer that measures the amount of nanomagnetic particles by placing a sample at any one of two points where harmonic peaks occur. However, since the differential coil is advantageous in that a received signal can be measured with high sensitivity, it must be inevitably included in a system intended to measure a very small amount of material.

That is, as illustrated in FIG. 1, in a conventional spectrometer for analyzing nanomagnetic particles, when a signal generator applies an Alternating-Current (AC) signal to an excitation solenoid coil 110, a magnetic field is produced, and a signal on the detection solenoid coil 120 is measured with a sample holder 100 being empty and is then used as a zeroing signal. Thereafter, when samples 101 and 102 containing nanomagnetic particles are inserted into the sample holder 100, magnetic-field signals additionally generated by the samples 101 and 102 magnetized via the magnetic field are detected by the detection solenoid coil 120. The signals detected in this way are measured via data acquisition (DAQ) and are used to analyze and estimate the properties of nanomagnetic particles.

However, although the conventional technology, such as that illustrated in FIG. 1, may be utilized as spectrometer technology, when the spatial distribution of samples is imaged or when consecutive samples are input, harmonic peaks occurring at two points may be cancelled or amplified, thus making it difficult to restore accurate values. For example, referring to FIG. 2, assuming that point A and point B are two points where harmonic peaks 210 and 220 occur, a signal value from a sample located at point B and a signal value from a sample having entered point A are added to each other, and the result of addition is detected by the detection solenoid coil, thus making it difficult to isolate values from respective samples.

PRIOR ART DOCUMENTS

Patent Documents (Patent Document 1) Korean Patent Application Publication No. 10-2018-0040306, Date of Publication: Apr. 20, 2018 (Title: Method for Transmitting and Receiving Signal for Signal Analysis of FMMD and Apparatus Using the Same)

SUMMARY OF THE INVENTION

Accordingly, the present invention has been made keeping in mind the above problems occurring in the prior art, and an object of the present invention is to provide an apparatus that enables image scanning by overcoming the limitation of a high-sensitivity spectrometer which uses a differential coil for signal detection, and by extending the functionality of the high-sensitivity spectrometer.

Another object of the present invention is to perform scanning on samples or to measure the amount of a measurement target in consecutive liquid-type samples by taking only one of two peaks detected by a differential coil as a valid peak.

In accordance with an aspect of the present invention to accomplish the above objects, there is provided a continuous scanning method using signal shielding, including producing a magnetic field on consecutively input samples by applying a signal to an excitation solenoid coil; blocking signal detection in a partial region so that only one harmonic peak is detected by a detection solenoid coil, which is a differential coil, using a magnetic field produced by at least one magnet; and sequentially detecting one harmonic peak in the samples based on the detection solenoid coil, and performing scanning of nanomagnetic particles on respective samples based on a signal for the detected harmonic peak.

The at least one magnet may saturate a magnetic field in a region in which a signal is detected by any one of two coils wound in different directions in accordance with the differential coil.

The at least one magnet may correspond to a doughnut-shaped disk-type magnet that encloses the detection solenoid coil.

A zero-crossing point corresponding to the detection solenoid coil may be formed at a location close to a remaining one coil for detecting the one harmonic peak, among the two coils wound in different directions.

Performing the scanning of the nanomagnetic particles may include generating results of scanning on respective samples based on a frequency domain of the detected signal, and imaging and outputting the results of the scanning.

A location of the at least one magnet may be determined in consideration of a sensitivity of the remaining one coil, which changes with a strength of the magnetic field produced by the at least one magnet.

The excitation solenoid coil may be located outside the detection solenoid coil and may produce a magnetic field in a region corresponding to a sample holder located inside the detection solenoid coil.

In accordance with another aspect of the present invention to accomplish the above objects, there is provided a continuous scanning apparatus using signal shielding, including an excitation solenoid coil for producing a magnetic field on consecutively input samples; a differential coil-type detection solenoid coil for detecting signals generated in the samples; at least one magnet for producing a magnetic field that blocks signal detection in a partial region so that only one harmonic peak is detected by the detection solenoid coil; a signal generation module for applying a signal to the excitation solenoid coil; and a processing module for performing scanning of nanomagnetic particles on respective samples based on one harmonic peak sequentially detected by the detection solenoid coil in accordance with the samples.

The at least one magnet may saturate a magnetic field in a region in which a signal is detected by any one of two coils wound in different directions in accordance with the differential coil.

The at least one magnet may correspond to a doughnut-shaped disk-type magnet that encloses the detection solenoid coil.

A zero-crossing point corresponding to the detection solenoid coil may be formed at a location close to a remaining one coil for detecting the one harmonic peak, among the two coils wound in different directions.

The processing module may generate results of scanning on respective samples based on a frequency domain of the detected signal, and may image and output the results of the scanning.

A location of the at least one magnet may be determined in consideration of a sensitivity of the remaining one coil, which changes with a strength of the magnetic field produced by the at least one magnet.

The excitation solenoid coil may be located outside the detection solenoid coil, and may produce a magnetic field in a region corresponding to a sample holder located inside the detection solenoid coil.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
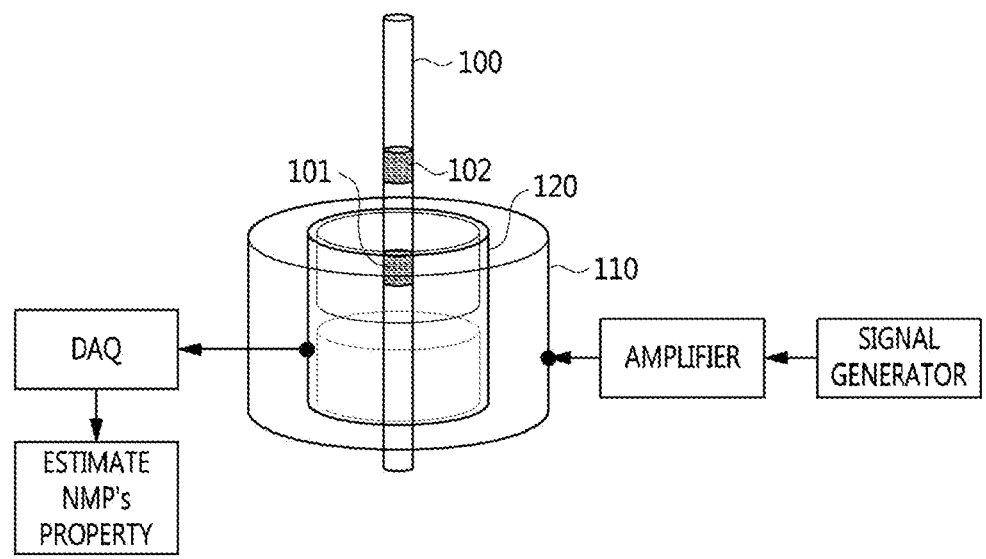
FIG. 1 is a diagram illustrating an example of a conventional spectrometer for analyzing nanomagnetic particles using a differential coil.
Figure 2:
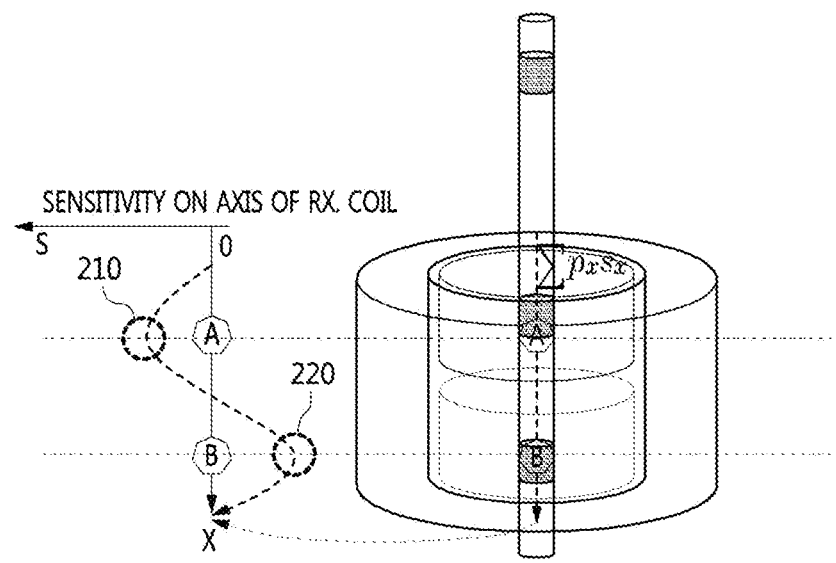
FIG. 2 is a diagram illustrating examples of points at which peaks are detected in the spectrometer illustrated in FIG. 1.

The present invention will be described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

Figure 3:
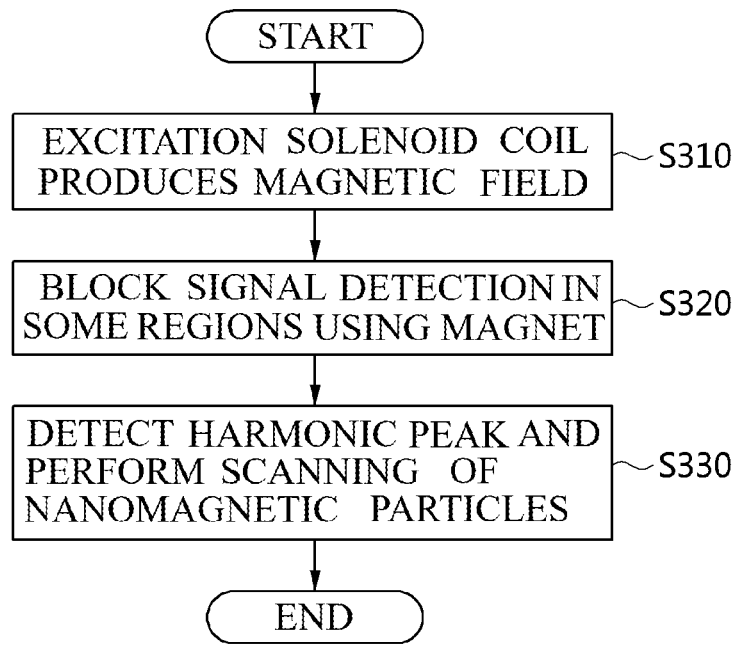
FIG. 3 is an operation flowchart illustrating a continuous scanning method using signal shielding according to an embodiment of the present invention.

Hereinafter, embodiments of the present invention will be described in detail with reference to the attached drawings:

FIG. 3 is an operation flowchart illustrating a continuous scanning method using signal shielding according to an embodiment of the present invention.

Below, there will be described a process for scanning nanomagnetic particles contained in consecutively input samples by preventing a harmonic peak from being detected at one of two points at which harmonic peaks occur in order to overcome the limitation of a spectrometer, which uses a differential coil as a detection solenoid coil for detecting a signal generated from a sample.

Referring to FIG. 3, the continuous scanning method using signal shielding according to the embodiment of the present invention produces a magnetic field in the consecutively input samples by applying a signal to an excitation solenoid coil at step S310.

Here, the excitation solenoid coil may be located outside a detection solenoid coil, and may produce a magnetic field in a region corresponding to a sample holder located inside the detection solenoid coil.

Figure 4:
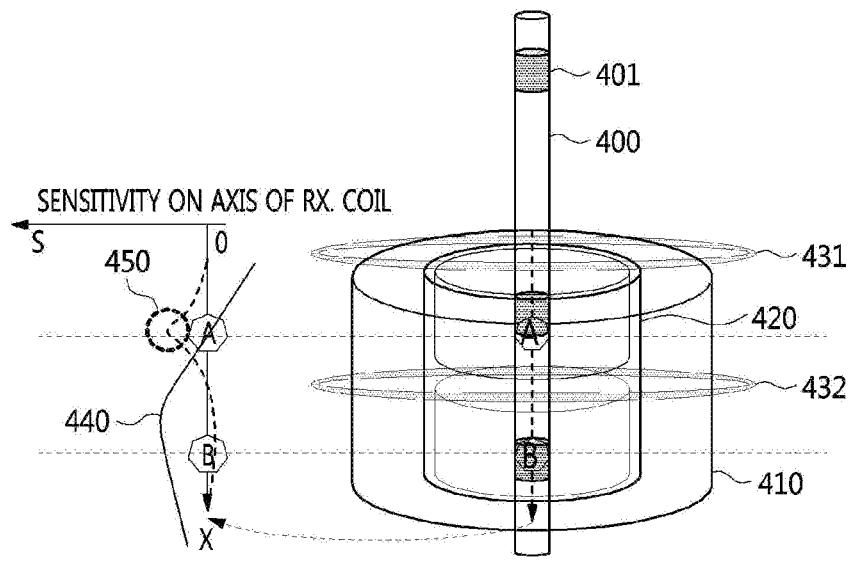
FIG. 4 is a diagram illustrating a continuous scanning apparatus using signal shielding according to an embodiment of the present invention.

For example, referring to FIG. 4, a continuous scanning apparatus according to an embodiment of the present invention may be configured such that a detection solenoid coil 420 is located so as to enclose a sample holder 400 through which each sample 401 passes, and an excitation solenoid coil 410 is located so as to enclose the detection solenoid coil 420 outside the detection solenoid coil 420.

Here, although not illustrated in FIG. 4, the excitation solenoid coil 410 may generate a magnetic field by receiving a signal from a separate signal generation module.

Here, the magnetic field produced in the excitation solenoid coil 410 may extend to the region corresponding to the sample holder 400 through which the sample 401 is moving, thus enabling the magnetic field to be applied to the sample 401.

Also, the continuous scanning method using signal shielding according to the embodiment of the present invention blocks signal detection in some regions so that only one harmonic peak is detected by the detection solenoid coil, which is a differential coil, using a magnetic field produced in at least one magnet at step S320.

For example, when, as illustrated in FIG. 4, samples are consecutively disposed at positions A and B in the conventional spectrometer, the value detected by the detection solenoid coil 420 may be $\Sigma p(x)s(x)$, obtained by integrating the result of multiplication of $s(x)$, which is measurement sensitivity at points A and B, and $p(x)$, which is the amount of nanomagnetic particles present at location x. Therefore, when the samples containing nanomagnetic particles are located at points A and B, respectively, it is not easy to separate the values of signals detected at the two points.

Therefore, in the present invention, a magnetic field is produced in the direction in which samples are scanned (e.g., the x-axis direction of FIG. 4) using an electromagnet or a permanent magnet, and thus signal detection in some regions may be blocked so that a harmonic peak 450 is detected only at one point, as illustrated in FIG. 4. That is, referring to FIG. 4, magnets 431 and 432 may be provided near the detection solenoid coil 420, and a harmonic peak may be prevented from being detected at point B due to magnetic fields produced in the magnets.

Here, at least one magnet may saturate a magnetic field in a region in which a signal is detected by any one of two coils wound in different directions in accordance with the differential coil.

For example, as illustrated in FIG. 4, when at least one magnet 431 or 432 is arranged, the magnetic field in the region corresponding to point B is saturated due to the magnetic field strength 440 of the magnet, and thus a harmonic peak attributable to the samples may not be detected at point B. That is, consecutively input samples may also be scanned by causing only a harmonic peak signal at any one point of harmonic peak signals detected at two points using the differential coil to be valid.

Here, a zero-crossing point corresponding to the detection solenoid coil may be formed at the location close to the remaining one coil, which detects one harmonic peak, of two coils wound in different directions.

For example, as illustrated in FIG. 4, a zero-crossing point may be formed at a location close to point A at which the harmonic peak is detected.

Therefore, in the present invention, as illustrated in the graph of FIG. 4, only a signal in a region other than the region in which the magnetic field is saturated may be detected by the magnets 431 and 432. That is, at point B, at which the magnetic field strength 440 of the magnet is large, a signal is not detected, and only signals at point A, at which the magnetic field strength 440 of the magnet is close to '0', may be detected.

Here, at least one magnet may correspond to a doughnut-shaped disk-type magnet enclosing the detection solenoid coil.

Figure 5:
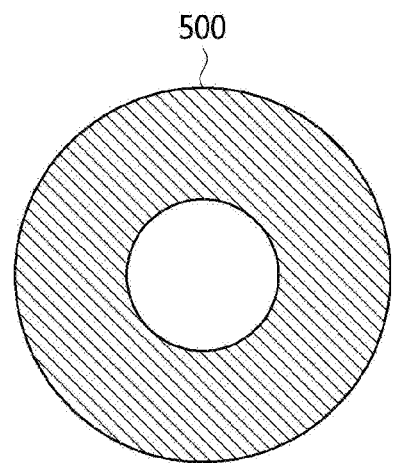
FIGS. 5 to 7 are diagrams illustrating examples of a magnet and the magnetic property of the magnet according to the present invention.

For example, the at least one magnet according to an embodiment of the present invention may correspond to a doughnut-shaped disk-type magnet, such as that illustrated in FIG. 5, in consideration of the location of insertion of the sample holder or the like.

Here, the location of the at least one magnet may be determined in consideration of the sensitivity of the remaining one coil, which changes with the strength of the magnetic field produced in the at least one magnet.

Figure 6:
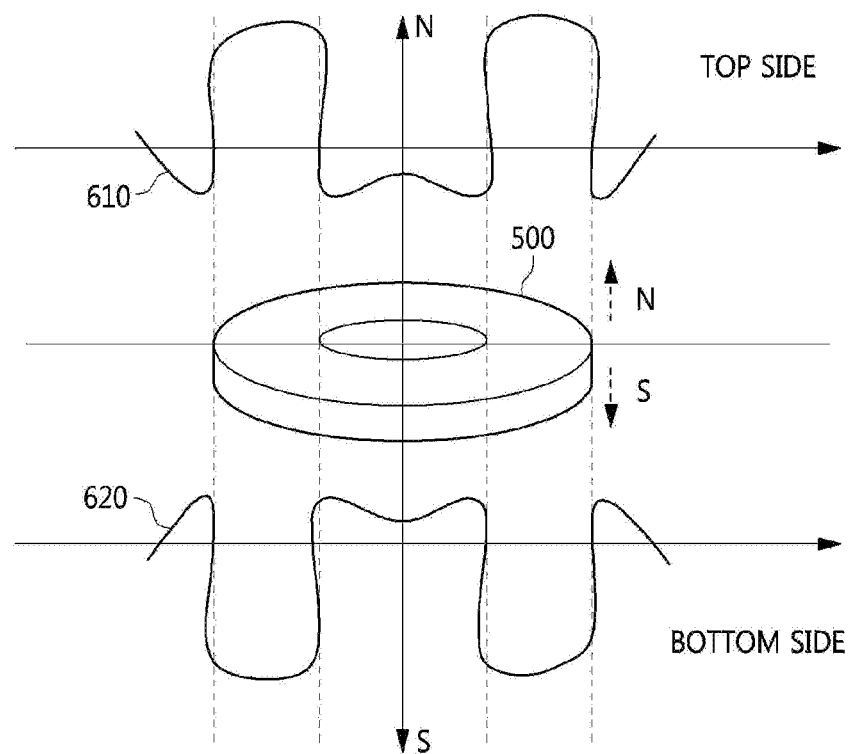

For example, the properties of a doughnut-shaped magnet 500 illustrated in FIG. 5 may be represented, as illustrated in FIG. 6. That is, a hole in the center of the doughnut shape is regarded as the magnet, and the magnet is installed to allow the same polarities (e.g., N poles or S poles) to be opposite each other and is spaced apart from the center of the hole by a predetermined distance, thus enabling the gradient of the magnetic field produced by the magnet to be set.

Here, by adjusting the strength of the magnetic force of the magnet and the distance of the magnet, a gradient in a desired [T/m] unit may be generated. In this case, as the gradient of the magnetic field produced by the magnet is larger, the sensitivity of the detection solenoid coil may be more sharply set.

Figure 7:
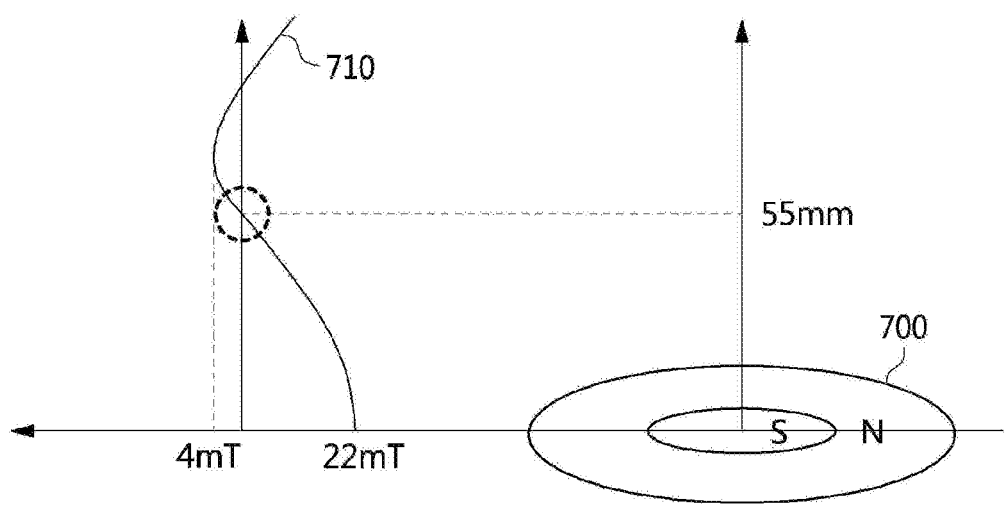

Assuming that the continuous scanning apparatus according to the embodiment of the present invention has the form of a small-sized measurement probe, a zero-crossing point may be configured and used using only one disk-type magnet. For example, when the magnetic force, that is, the magnetic property 710 of a doughnut-shaped magnet 700, depending on the distance from the center of the hole of the doughnut-shaped magnet 700, is measured, as illustrated in FIG. 7, the magnetic property 710 may be represented by the graph on the left side of FIG. 7. Referring to the graph of FIG. 7, it can be seen that a zero-crossing point is generated at the location spaced apart from the center of the hole by 55 mm on a vertically asymmetric curve for the magnetic property 710. Here, the vertically asymmetric curve has a magnetic force of 4 mT on a top side and a maximum of 22 mT on a bottom side, and thus a gradient of about 0.33[T/m]$(=(22-4)/55)$ occurs, which may be a value that can be utilized to measure most nanomagnetic particles.

Since the gradient slope obtained in the case where a single magnet is used may be less than or equal to half that obtained in the case where two magnets are used, the magnet may be arranged and used in various manners depending on the size of the continuous scanning apparatus that is desired to be applied or the type of sample to be scanned through the continuous scanning apparatus.

Because a zero-crossing point having a high gradient is generated by exploiting an electromagnet or a permanent magnet, signal detection in some regions may be blocked so that a valid harmonic peak is detected only at any one point of harmonic peaks observed at two points.

Further, the continuous scanning method using signal shielding according to the embodiment of the present invention may sequentially detect one harmonic peak signal detected in samples based on the detection solenoid coil, and may perform scanning of nanomagnetic particles on respective samples based on the detected peak signal at step S330.

Figure 8:
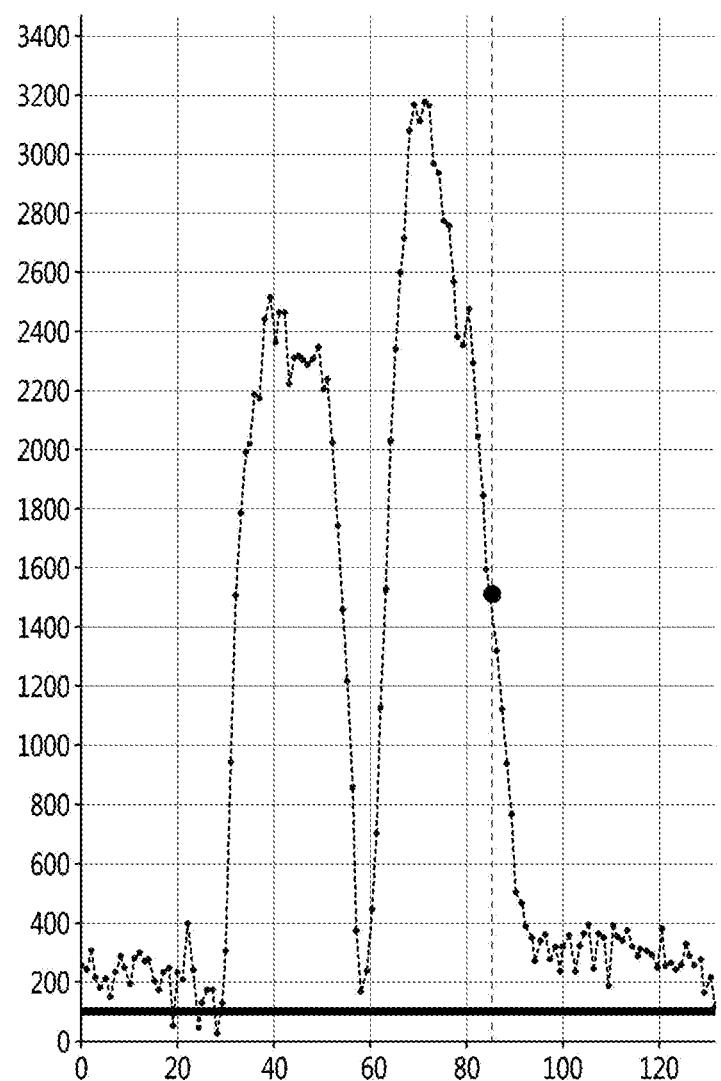
FIG. 8 is a diagram illustrating an example of the results of scanning by a conventional spectrometer for analyzing nanomagnetic particles using a differential coil.

That is, since, in the conventional technology, harmonic peaks are observed at two points, as illustrated in FIG. 8, a problem arises in that signals overlap each other due to the consecutively inserted samples. In contrast, since, in the present invention, a harmonic peak is observed only at one point, as illustrated in FIG. 9, the present invention may be used for scanning for consecutive (continuous) samples such as those having liquid forms.

Figure 9:
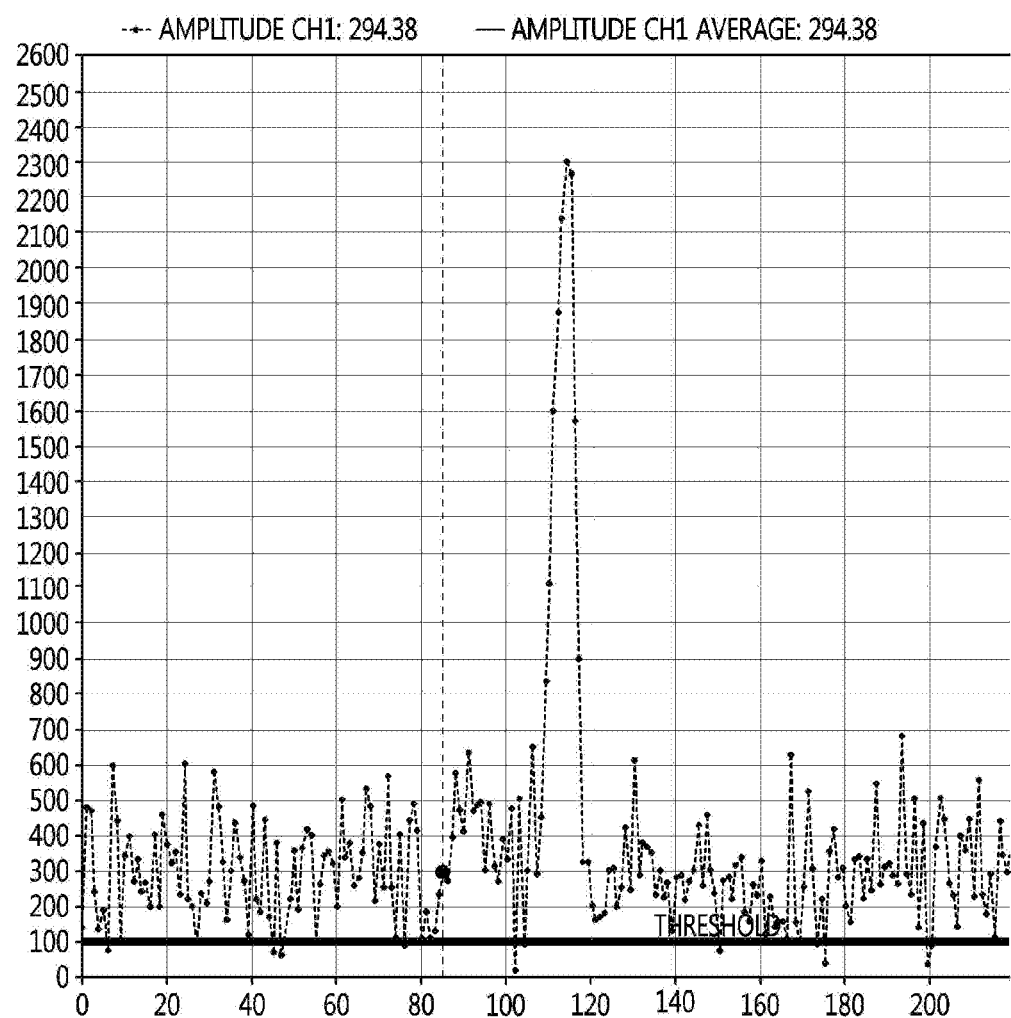
FIG. 9 is a diagram illustrating an example of the results of scanning of nanomagnetic particles according to the present invention.

Here, the X axis in FIGS. 8 and 9 may denote a scanning time, and the Y axis may denote measurement values (MicroV) obtained using a spectrometer.

Here, based on the frequency domain of the detected signal, the results of scanning of respective samples may be generated, and the scanning results may be imaged and output.

Further, the continuous scanning method using signal shielding according to the embodiment of the present invention may locate at least one magnet at an accurate point among the scanning locations of the continuous scanning apparatus of FIG. 4 by enabling the at least one magnet to be finely movable using a separate stage module, a screw, or the like.

Furthermore, although not illustrated in FIG. 3, the continuous scanning method using signal shielding according to the embodiment of the present invention may store various types of information generated during the above-described continuous scanning process in a separate storage module.

By utilizing the continuous scanning method using signal shielding, an apparatus enabling image scanning may be provided by overcoming the limitation of a high-sensitivity spectrometer which uses a differential coil for signal detection and by extending the functionality of the high-sensitivity spectrometer.

In addition, among two peaks detected by the differential coil, only one peak may be detected as a valid peak, so that scanning of a sample may be performed or so that the amount of a measurement target may be measured for consecutive liquid-type samples.

FIG. 4 is a diagram illustrating a continuous scanning apparatus using signal shielding according to an embodiment of the present invention.

Referring to FIG. 4, the continuous scanning apparatus using signal shielding according to the embodiment of the present invention may include an excitation solenoid coil 410, a detection solenoid coil 420, a sample holder 400, and one or more magnets 431 and 432.

Here, although not illustrated in FIG. 4, the continuous scanning apparatus using signal shielding according to the embodiment of the present invention may further include a signal generation module and a processing module.

The signal generation module according to an embodiment of the present invention may produce a magnetic field on consecutively input samples by applying a signal to the excitation solenoid coil 410.

Here, the excitation solenoid coil 410 may be located outside the detection solenoid coil 420, and may produce a magnetic field in a region corresponding to a sample holder 400 located inside the detection solenoid coil 420.

For example, referring to FIG. 4, a continuous scanning apparatus according to an embodiment of the present invention may be configured such that a detection solenoid coil 420 is located so as to enclose a sample holder 400 through which each sample 401 passes, and an excitation solenoid coil 410 is located so as to enclose the detection solenoid coil 420 outside the detection solenoid coil 420.

Here, although not illustrated in FIG. 4, the excitation solenoid coil 410 may generate a magnetic field by receiving a signal from a separate signal generation module.

Here, the magnetic field produced in the excitation solenoid coil 410 may extend to the region corresponding to the sample holder 400 through which the sample 401 is moving, thus enabling the magnetic field to be applied to the sample 401.

Further, in accordance with an embodiment of the present invention, signal detection in some regions is blocked such that only one harmonic peak is detected by the detection solenoid coil, which is a differential coil, using a magnetic field produced in at least one magnet 431 or 432.

For example, when, as illustrated in FIG. 4, samples are consecutively disposed at positions A and B in the conventional spectrometer, the value detected by the detection solenoid coil 420 may be $\Sigma p(x)s(x)$, obtained by integrating the result of multiplication of $s(x)$, which is measurement sensitivity at points A and B, and $p(x)$, which is the amount of nanomagnetic particles present at location x. Therefore, when the samples containing nanomagnetic particles are located at points A and B, respectively, it is not easy to separate the values of signals detected at the two points.

Therefore, in the present invention, a magnetic field is produced in the direction in which samples are scanned (e.g., the x-axis direction of FIG. 4) using an electromagnet or a permanent magnet, and thus signal detection in some regions may be blocked so that a harmonic peak 450 is detected only at one point, as illustrated in FIG. 4. That is, referring to FIG. 4, magnets 431 and 432 may be provided near the detection solenoid coil 420, and a harmonic peak may be prevented from being detected at point B due to magnetic fields produced in the magnets.

Here, at least one magnet may saturate a magnetic field in a region in which a signal is detected by any one of two coils wound in different directions in accordance with the differential coil.

For example, as illustrated in FIG. 4, when at least one magnet 431 or 432 is arranged, the magnetic field in the region corresponding to point B is saturated due to the magnetic field strength 440 of the magnet, and thus a harmonic peak attributable to the samples may not be detected at point B. That is, consecutively input samples may also be scanned by causing only a harmonic peak signal at any one point of harmonic peak signals detected at two points using the differential coil to be valid.

Here, a zero-crossing point corresponding to the detection solenoid coil may be formed at the location close to the remaining one coil, which detects one harmonic peak, of two coils wound in different directions.

For example, as illustrated in FIG. 4, a zero-crossing point may be formed at a location close to point A at which the harmonic peak is detected.

Therefore, in the present invention, as illustrated in the graph of FIG. 4, only a signal in a region other than the region in which the magnetic field is saturated may be detected by the magnets 431 and 432. That is, at point B, at which the magnetic field strength 440 of the magnet is large, a signal is not detected, and only signals at point A, at which the magnetic field strength 440 of the magnet is close to '0', may be detected.

Here, at least one magnet may correspond to a doughnut-shaped disk-type magnet enclosing the detection solenoid coil.

For example, the at least one magnet according to an embodiment of the present invention may correspond to a doughnut-shaped disk-type magnet, such as that illustrated in FIG. 5, in consideration of the location of insertion of the sample holder or the like.

Here, the location of the at least one magnet may be determined in consideration of the sensitivity of the remaining one coil, which changes with the strength of the magnetic field produced in the at least one magnet.

For example, the properties of a doughnut-shaped magnet 500 illustrated in FIG. 5 may be represented, as illustrated in FIG. 6. That is, a hole in the center of the doughnut shape is regarded as the magnet, and the magnet is installed to allow the same polarities (e.g., N poles or S poles) to be opposite each other and is spaced apart from the center of the hole by a predetermined distance, thus enabling the gradient of the magnetic field produced by the magnet to be set.

Here, by adjusting the strength of the magnetic force of the magnet and the distance of the magnet, a gradient in a desired [T/m] unit may be generated. In this case, as the gradient of the magnetic field produced by the magnet is larger, the sensitivity of the detection solenoid coil may be more sharply set.

Assuming that the continuous scanning apparatus according to the embodiment of the present invention has the form of a small-sized measurement probe, a zero-crossing point may be configured and used using only one disk-type magnet. For example, when the magnetic force, that is, the magnetic property 710 of a doughnut-shaped magnet 700, depending on the distance from the center of the hole of the doughnut-shaped magnet 700, is measured, as illustrated in FIG. 7, the magnetic property 710 may be represented by the graph on the left side of FIG. 7. Referring to the graph of FIG. 7, it can be seen that a zero-crossing point is generated at the location spaced apart from the center of the hole by 55 mm on a vertically asymmetric curve for the magnetic property 710. Here, the vertically asymmetric curve has a magnetic force of 4 mT on a top side and a maximum of 22 mT on a bottom side, and thus a gradient of about 0.33[T/m](=(22−4)/55) occurs, which may be a value that can be utilized to measure most nanomagnetic particles.

Since the gradient slope obtained in the case where a single magnet is used may be less than or equal to half that obtained in the case where two magnets are used, the magnet may be arranged and used in various manners depending on the size of the continuous scanning apparatus that is desired to be applied or the type of sample to be scanned through the continuous scanning apparatus.

Because a zero-crossing point having a high gradient is generated by exploiting an electromagnet or a permanent magnet, signal detection in some regions may be blocked so that a valid harmonic peak is detected only at any one point of harmonic peaks observed at two points.

Further, in accordance with an embodiment of the present disclosure, the processing module sequentially detects one harmonic peak signal detected in samples based on the detection solenoid coil 420, and performs scanning of nanomagnetic particles on respective samples based on the detected peak signal.

That is, since, in the conventional technology, harmonic peaks are observed at two points, as illustrated in FIG. 8, a problem arises in that signals overlap each other due to the consecutively inserted samples. In contrast, since, in the present invention, a harmonic peak is observed only at one point, as illustrated in FIG. 9, the present invention may be used for scanning for consecutive (continuous) samples such as those having liquid forms.

Here, the X axis in FIGS. 8 and 9 may denote a scanning time, and the Y axis may denote measurement values (MicroV) obtained using a spectrometer.

Here, based on the frequency domain of the detected signal, the results of scanning of respective samples may be generated, and the scanning results may be imaged and output.

Further, although not illustrated in FIG. 4, the continuous scanning apparatus using signal shielding according to the embodiment of the present invention may locate at least one magnet at an accurate point among the scanning locations of the continuous scanning apparatus of FIG. 4 by enabling the at least one magnet to be finely movable using a separate stage module, a screw, or the like.

By means of the continuous scanning apparatus using signal shielding, an apparatus enabling image scanning may be provided by overcoming the limitation of a high-sensitivity spectrometer which uses a differential coil for signal detection and by extending the functionality of the high-sensitivity spectrometer.

In addition, among two peaks detected by the differential coil, only one peak may be detected as a valid peak, so that scanning of a sample may be performed or so that the amount of a measurement target may be measured for consecutive liquid-type samples.

In accordance with the present invention, there can be provided an apparatus that enables image scanning by overcoming the limitation of a high-sensitivity spectrometer which uses a differential coil for signal detection, and by extending the functionality of the high-sensitivity spectrometer.

Further, the present invention may perform scanning of samples or measure the amount of a measurement target in consecutive liquid-type samples by taking only one of two peaks detected by a differential coil as a valid peak.

As described above, in the continuous scanning method using signal shielding and the apparatus for the continuous scanning method according to the present invention, the configurations and schemes in the above-described embodiments are not limitedly applied, and some or all of the above embodiments can be selectively combined and configured such that various modifications are possible.

What is claimed is:

1. A continuous scanning method using signal shielding, comprising:
producing a magnetic field on consecutively input samples by applying a signal to an excitation solenoid coil;
blocking signal detection in a partial region so that only one harmonic peak is detected by a detection solenoid coil, which is a differential coil, using a magnetic field produced by at least one magnet; and
sequentially detecting one harmonic peak in the samples based on the detection solenoid coil, and performing scanning of nanomagnetic particles on respective samples based on a signal for the detected harmonic peak.

2. The continuous scanning method of claim 1, wherein the at least one magnet saturates a magnetic field in a region in which a signal is detected by any one of two coils wound in different directions in accordance with the differential coil.

3. The continuous scanning method of claim 2, wherein the at least one magnet corresponds to a doughnut-shaped disk-type magnet that encloses the detection solenoid coil.

4. The continuous scanning method of claim 2, wherein a zero-crossing point corresponding to the detection solenoid coil is formed at a location close to a remaining one coil for detecting the one harmonic peak, among the two coils wound in different directions.

5. The continuous scanning method of claim 1, wherein performing the scanning of the nanomagnetic particles comprises generating results of scanning on respective samples based on a frequency domain of the detected signal, and imaging and outputting the results of the scanning.

6. The continuous scanning method of claim 4, wherein a location of the at least one magnet is determined in consideration of a sensitivity of the remaining one coil, which changes with a strength of the magnetic field produced by the at least one magnet.

7. The continuous scanning method of claim 1, wherein the excitation solenoid coil is located outside the detection solenoid coil and produces a magnetic field in a region corresponding to a sample holder located inside the detection solenoid coil.

8. A continuous scanning apparatus using signal shielding, comprising:
an excitation solenoid coil for producing a magnetic field on consecutively input samples;
a differential coil-type detection solenoid coil for detecting signals generated in the samples;
at least one magnet for producing a magnetic field that blocks signal detection in a partial region so that only one harmonic peak is detected by the detection solenoid coil;
a signal generation module for applying a signal to the excitation solenoid coil; and
a processing module for performing scanning of nanomagnetic particles on respective samples based on one harmonic peak sequentially detected by the detection solenoid coil in accordance with the samples.

9. The continuous scanning apparatus of claim 8, wherein the at least one magnet saturates a magnetic field in a region in which a signal is detected by any one of two coils wound in different directions in accordance with the differential coil.

10. The continuous scanning apparatus of claim 9, wherein the at least one magnet corresponds to a doughnut-shaped disk-type magnet that encloses the detection solenoid coil.

11. The continuous scanning apparatus of claim 9, wherein a zero-crossing point corresponding to the detection solenoid coil is formed at a location close to a remaining one coil for detecting the one harmonic peak, among the two coils wound in different directions.

12. The continuous scanning apparatus of claim 8, wherein the processing module generates results of scanning on respective samples based on a frequency domain of the detected signal, and images and outputs the results of the scanning.

13. The continuous scanning apparatus of claim 11, wherein a location of the at least one magnet is determined in consideration of a sensitivity of the remaining one coil, which changes with a strength of the magnetic field produced by the at least one magnet.

14. The continuous scanning apparatus of claim 8, wherein the excitation solenoid coil is located outside the detection solenoid coil and produces a magnetic field in a region corresponding to a sample holder located inside the detection solenoid coil.

\* \* \* \* \*